United States Patent [19]

Nguyen-Kim et al.

[11] Patent Number: 5,034,305
[45] Date of Patent: * Jul. 23, 1991

[54] RADIATION-SENSITIVE MIXTURE

[75] Inventors: Son Nguyen-Kim, Hemsbach; Gerhard Hoffmann, Otterstadt; Reinhold Schwalm, Wachenheim; Horst Binder, Lampertheim, all of Fed. Rep. of Germany

[73] Assignee: BASF Aktiengesellschaft, Ludwigshafen, Fed. Rep. of Germany

[ * ] Notice: The portion of the term of this patent subsequent to Jul. 30, 2008 has been disclaimed.

[21] Appl. No.: 422,454

[22] Filed: Oct. 17, 1989

[30] Foreign Application Priority Data

Nov. 4, 1988 [DE] Fed. Rep. of Germany ....... 3837513

[51] Int. Cl.$^5$ ................................................ G03C 1/72
[52] U.S. Cl. .................................... 430/270; 430/326; 430/330; 430/272
[58] Field of Search ................ 430/270, 326, 330, 272

[56] References Cited

U.S. PATENT DOCUMENTS

| | | |
|---|---|---|
| 3,915,706 | 10/1975 | Limburg et al. |
| 4,284,706 | 8/1981 | Clecak et al. ................ 430/326 |
| 4,311,782 | 1/1982 | Buhr et al. ................... 430/270 |
| 4,491,628 | 1/1985 | Ito et al. |
| 4,624,908 | 11/1986 | Schwartzkopf ............... 430/326 |
| 4,678,737 | 7/1987 | Schneller et al. |
| 4,689,288 | 8/1987 | Buiguez et al. |
| 4,737,426 | 4/1988 | Roth ............................ 430/326 |
| 4,770,977 | 9/1988 | Buiguez et al. |
| 4,808,512 | 2/1989 | Schwartzkopf ............... 430/326 |
| 4,877,719 | 10/1989 | Hagashi et al. ............... 430/326 |

FOREIGN PATENT DOCUMENTS 291994 11/1988 European Pat. Off. ......... 430/270

OTHER PUBLICATIONS

Applications of Photoinitiated Cationic Polymerization Toward the Development of New Photoresists, Crivello, Polym. Sci., 48, pp. 65-69 (1985).
J. Polym. Sci., Part A, Chem. Ed., vol. 24, 2971-1980 (1986).

*Primary Examiner*—Marion E. McCamish
*Assistant Examiner*—Christopher D. Rodee
*Attorney, Agent, or Firm*—Keil & Weinkauf

[57] ABSTRACT

The invention relates to a radiation-sensitive mixture essentially consisting of
(a) a water-insoluble binder or binder mixture which is soluble in aqueous alkaline solutions,
(b) a compound which upon irradiation forms a strong acid and
(c) one or more organic compounds which inhibit the solubility of (a) in aqueous alkaline solutions, wherein the organic compound (c) is a $\beta$-ketoacide ester.

This radiation-sensitive mixture may be used to prepare photoresists.

13 Claims, No Drawings

RADIATION-SENSITIVE MIXTURE

The present invention relates to positively-working radiation-sensitive mixtures which contain a water-insoluble binder which is soluble in aqueous alkaline solutions, a compound which forms an acid under the influence of radiation and an organic compound which under acid catalysis is hydrolyzed and decarboxylated, thereby increasing the alkali solubility of the mixture. These mixtures are sensitive to UV radiation, electron beams and X-rays and are particularly suitable for use as a resist material.

Positively working radiation-sensitive mixtures are known and in particular positively working resist materials which contain o-quinonediazides in binders soluble in aqueous alkali, e.g. novolacs or poly-p-vinylphenols are employed commercially. However, the sensitivity of these systems to radiation, especially short-wave radiation, is in part unsatisfactory.

Increases of sensitivity in radiation-sensitive systems which in the primary photoreaction produce a species which then, independently of the radiation, triggers a catalytic secondary reaction have been disclosed. For example, U.S. Pat. No. 3,915,706 describes photo-initiators which produce a strong acid which then, in a secondary reaction, cleaves acid-labile groups, such as polyaldehyde groups.

Further, radiation-sensitive mixtures based on acid-cleavable compounds are known which contain a polymer soluble in aqueous alkali as the binder, together with a compound which photochemically forms a strong acid and a further compound having acid-cleavable bonds, which as a result of the action of the acid increase in solubility in an alkaline developer (cf. DE-A 3,406,927). Compounds mentioned as photochemically forming a strong acid are diazonium, phosphonium, sulfonium and iodonium compounds as well as halogen compounds. The use of such onium salts as photochemical acid donors in resist materials is also disclosed, for example, in U.S. Pat. No. 4,491,628. A survey of the use of onium salts and resist materials is given by Crivello in Org. Coatings and Appl. Polym. Sci., 48 (1985), 65–69.

Radiation-sensitive mixtures of polymers having acid-labile side groups and photochemical acid donors are disclosed, for example, in U.S. Pat. No. 4,491,628 and FR-A 2,570,844. However, these polymeric binders are hydrophobic and only become alkali-soluble after exposure.

Copolymers with phenolic and acid-labile groups, for example poly-(p-hydroxystyrene-co-t-butoxycarbonyloxystyrene) are known from J. Polym. Sci., Part A, Polym. Chem. Ed., 24 (1986), 2971–2980. However, if those copolymers of the said group which are still alkali-soluble are used in conjunction with commercial sulfonium salts such as triphenylphosphonium hexafluoroarsenate, as also described in U.S. Pat. No. 4,491,628, the mixtures have the disadvantage that very extensive removal of the unexposed areas takes place, since the said sulfonium salts do not adequately contribute to solubility inhibition. Furthermore, these salts, after exposure, do not contribute to increasing the solubility of the irradiated areas in alkaline developers, since no alkali-soluble photoproducts are formed.

DE-A 3,721,741 describes radiation-sensitive mixtures which contain a polymeric binder soluble in aqueous alkaline solutions together with an organic compound of which the solubility in an aqueous alkaline developer is increased by the action of acid and which contains at least one acid-cleavable group, this organic compound forming a strong acid under the influence of radiation.

It is an object of the present invention to provide novel positively working highly active radiation-sensitive systems for the production of relief structures, which systems can be developed with aqueous alkaline solutions and which permit the preparation of coatings which are sensitive to short-wave ultraviolet.

To use such materials, a radiation-sensitive mixture which contains a water-insoluble binder soluble in aqueous alkaline solution, an acid-labile organic compound which is hydrolyzed under the influence of acid and is decarboxylated at an elevated temperature, and a compound which upon irradiation forms a strong acid, is to be irradiated imagewise and heated, and the imagewise-irradiated areas of the layer are to be washed out with developer solution.

We have found, surprisingly, that these objects are achieved and that highly active radiation-sensitive systems for the production of relief structures, the systems being responsive to short-wave ultraviolet and being distinguished particularly by very good reproducibility and high resolution, are obtained by the use of β-ketocarboxylic acid esters as compounds which inhibit the solubility of binders in aqueous alkaline solutions.

Accordingly, the present invention relates to a radiation-sensitive mixture essentially consisting of (a) a water-insoluble binder or binder mixture which is soluble in aqueous alkaline solutions, (b) a compound which upon irradiation forms a strong acid and (c) one or more organic compounds which inhibit the solubility of (a) in aqueous alkaline solutions, wherein the organic compound (c) is a β-ketoacid ester of the general formula (I)

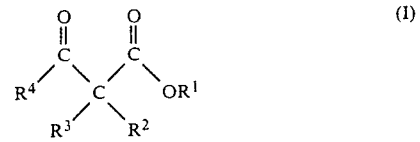

where
$R^1$ is alkyl, cycloalkyl, aralkyl or an oxygen-containing heterocyclic radical,
$R^2$ and $R^3$ are identical or different and each is hydrogen, halogen, alkyl, cycloalkyl, aralkyl, aryl, alkoxy or $-CO-OR^1$, or $R^1$ together with $R^2$, or $R^3$ together with $R^4$ are linked by $-(CH_2)_n-$, where n is from 2 to 5, to form a ring, and
$R^4$ is alkyl, cycloalkyl, aryl or $-CH_2-CO-OR^1$.

The radiation-sensitive mixture may contain, as binder (a), a phenolic resin, for example a novolac with a mean molecular weight $M_n$ of from 300 to 20,000, a copolymer of p-hydroxystyrene and p-tert.-butoxycarbonyloxystyrene, a copolymer of p-hydroxystyrene and an alkoxystyrene or a copolymer of p-hydroxystyrene and 2-tetrahydropyranyloxystyrene, or a mixture of these.

The preferred compounds (b) which on irradiation form a strong acid are sulfonium salts of the general formula (II)

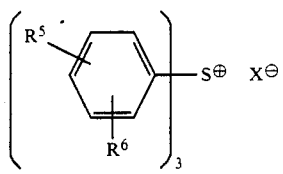

and iodonium of the general formula (III)

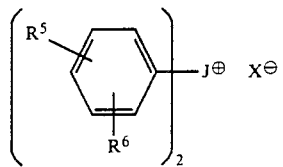

where $R^5$ and $R^6$ may be identical or different and each is H, OH or one of the radicals

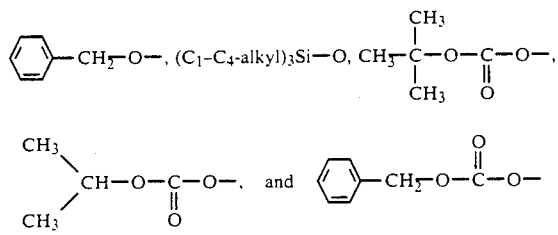

and $X^\ominus = Cl^\ominus$, $Br^\ominus$, $ClO_4^\ominus$, hexafluoroarsenate, hexafluoroantimonate, hexafluorophosphate and/or tetrafluoroborate.

Preferred β-ketocarboxylic acid esters are acetoacetic acid esters from the group of tert.-butyl acetoacetate, isobutyl acetoacetate, 2-tetrahydropyranyl acetoacetate, trimethylsilyl acetoacetate and cyclohexyl acetoacetate, as well as dimethyl, diethyl or di-tert.-butyl acetonedicarboxylate, dialkyl malonate derivatives from the group of dimethyl acetylmalonate, dimethyl propionylmalonate, diethyl propionylmalonate, di-tert.-butyl propionylmalonate, di-iso-butyl acetylmalonate, di(trimethylsilyl) propionylmalonate and di(trimethylsilyl) benzoylmalonate, as well as compounds of the general formula (IV)

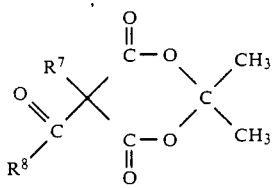

where
$R^7$ is Br or $CH_3$ and
$R^8$ is $CH_3$ or $C_2H_5$.

The present invention further relates to a process for the preparation of relief structures or for the structuring of wafers by applying a photoresist solution in a thickness of from 0.1 to 5 μm onto a conventionally treated substrate, drying the coating, exposing it imagewise, with or without subsequent heating at up to 150° C., and developing with an aqueous alkaline solution, where the photoresist solution employed contains a radiation-sensitive mixture according to the invention.

The process according to the invention is particularly advantageous since it ensures very good reproducibility. The relief structures obtained by the process exhibit high resolution.

The following detailed comments relate to the components of the radiation-sensitive mixture according to the invention.

a) Because of plasma etching resistance which is in most cases required, the water-insoluble binders or binder mixtures which are soluble in aqueous alkaline solutions are in general phenolic resins, eg. novolacs having molecular weights $M_n$ from 200 to 20,000, preferably from 300 to 2,000 g/mole and, for exposures to short-wave ultraviolet ($\leq 300$ nm) especially novolacs based on p-cresol/formaldehyde, poly(p-hydroxystryenes) and poly(p-hydroxy-α-methylstyrenes), these poly(p-hydroxystyrenes) in general having molecular weights $M_n$ of from 200 to 100,000, preferably from 1,000 to 40,000, g/mole; they can furthermore also be modified in a conventional manner by a polymer-analogous reaction of their hydroxyl groups with, for example, chloroacetic acid, chloroacetic acid esters, alkyl halides, benzyl halides, 3,4-dihydropyran, dihydrofuran, chlorocarbonic acid esters and/or pyrocarbonic acid esters. The polymeric binders (a) thus obtainable, which for the purposes of this application are also to be understood as copolymers, are, for example, based on p-hydroxystyrene and p-tert.-butoxycarbonyloxystyrene, p-hydroxystyrene and an alkoxystyrene or p-hydroxystyrene and 2-tetrahydropyranyloxystyrene. Preferred copolymers of p-hydroxystyrene, which bear lateral protective groups, essentially contain groups of the formula

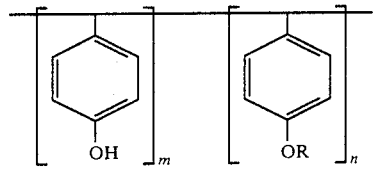

where
n is less than or equal to m and
R is

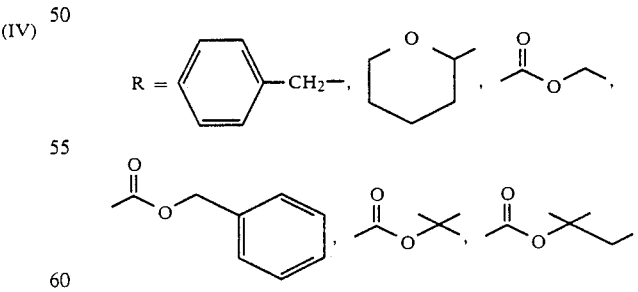

i.e. copolymers which contain p-benzyloxystyrene, p-(2-tetrahydropyranyl)-oxystyrene, p-(iso-propyloxycarbonyl)-oxystyrene, p-(cyclohexyloxycarbonyl)-oxystyrene, p-(benzyloxycarbonyl)-oxystyrene, p-(t.butyloxycarbonyl)-oxystyrene and/or p-(t-pentyloxycarbonyl)-oxystyrene units. Mixtures of the above binders (a) may also be used.

The binder (a) is in general present in the mixture according to the invention in an amount of from 45 to 95, preferably from 80 to 90, % by weight, based on the total amount of the radiation-sensitive mixture (a)+(b)+(c).

b) Suitable compounds (b) which on irradiation form a strong acid are in principle all compounds which possess this property and accordingly act as acid donors. However, iodonium salts especially sulfonium salts are preferred for irradiation with short-wave ultraviolet. These salts correspond to the general formula (II) or (III)

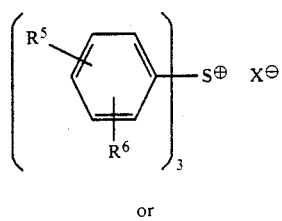

(II)

or

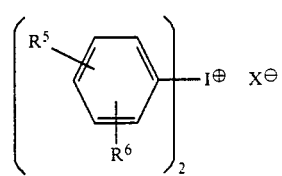

(III)

where
$R^5$ and $R^6$=H, (triphenylsulfonium salt or diphenyliodonium salt), OH

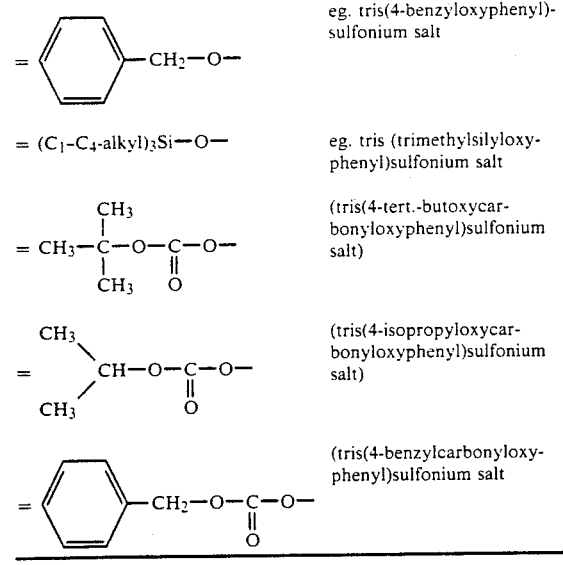

$X^\ominus$=$Cl^\ominus$, $Br^\ominus$, $ClO_4^\ominus$, $AsF_6^\ominus$, $PF_6^\ominus$, $SbF_6^\ominus$ and/or $BF_4^\ominus$.

Mixtures of the compounds mentioned under (b) may also be employed. In general, the amount of component (b) in the radiation-sensitive mixture according to the invention is from 0.1 to 20, preferably from 2 to 10, % by weight, based on the total amount of the radiation-sensitive mixture (a)+(b)+(c).

c) According to the invention, the organic compound (c) employed to inhibit the dissolution of the binder (a) is a β-ketocarboxylic acid ester of the general formula (I)

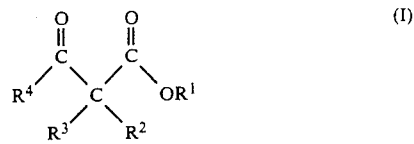

(I)

where
$R^1$ is alkyl, e.g. n-alkyl of 1 to 5 carbon atoms, sec.-alkyl of 3 to 6 carbon atoms, tert.-alkyl of 4 or 5 carbon atoms, for example methyl, ethyl, n-propyl, i-propyl, n-butyl, iso-butyl or tert.-butyl, cycloalkyl, e.g. cyclohexyl, aralkyl, eg. benzyl, or an oxygen-containing heterocyclic radical, for example

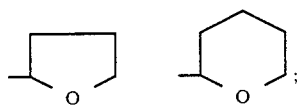

$R^2$ and $R^3$ are identical or different and each is hydrogen, halogen, eg. Cl or Br, alkyl, eg. n-alkyl of 1 to 5 carbon atoms, such as methyl or ethyl, sec.-alkyl of 3 to 6 carbon atoms, such as isopropyl and isobutyl, cycloalkyl, such as cyclohexyl, aralkyl, such as benzyl, aryl, such as phenyl, alkoxy, such as methoxy or ethoxy, halogen-substituted aryl, such as chlorophenyl, or —CO—OR$^1$, or R$^1$ together with R$^2$, or R$^3$ together with R$^4$ are linked via —(CH$_2$)$_n$, where n is from 2 to 5, to form a ring, for example a 5-membered, 6-membered or 7-membered ring, and $R^4$ is alkyl, e.g. n-alkyl of 1 to 5 carbon atoms, such as methyl, ethyl, propyl or n-butyl, sec.-alkyl of 3 to 6 carbon atoms, eg. isopropyl or isobutyl, cycloalkyl, e.g. cyclohexyl, aryl, eg. phenyl, or —CH$_2$—C=O—OR$^1$.

Further examples of β-ketocarboxylic acid esters suitable for use in accordance with the invention are:

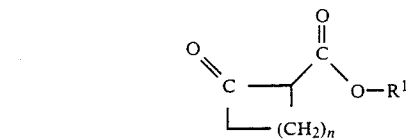

where n is from 3 to 5

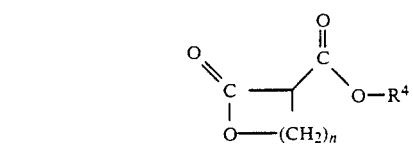

where n is from 2 to 4

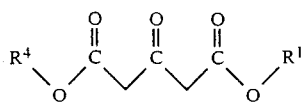

where $R^1$=$R^4$=n-alkyl of 1 to 3 carbon atoms, sec.-alkyl of 3 to 6 carbon atoms or tert.-alkyl of 4 to 6 carbon atoms,

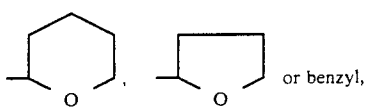 or benzyl,

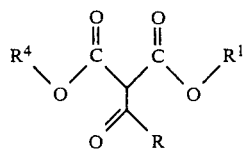

where R is n-alkyl of 1 to 3 carbon atoms, aryl, halogenated aryl (e.g. chlorophenyl) or benzyl, and $R^1$ and $R^4$ are as defined above,

| | |
|---|---|
| 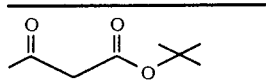 | tert.-butyl acetoacetate |
| 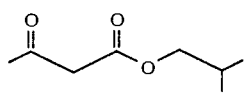 | iso-butyl acetoacetate |
| 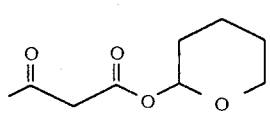 | 2-tetrahydropyranyl acetoacetate |
| 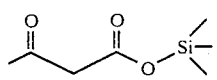 | trimethylsilyl acetoacetate |
| 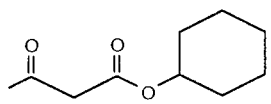 | cyclohexyl acetoacetate |
| 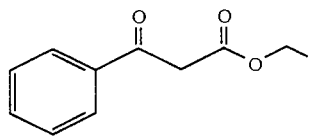 | ethyl benzoylacetate |
| 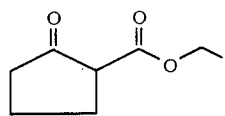 | 2-carbethoxy-cyclopentanone |
| 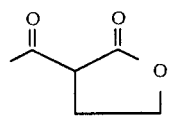 | 2-acetyl-butyrolactone |
| 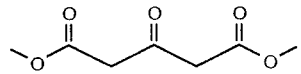 | dimethyl acetonedicarboxylate |
| 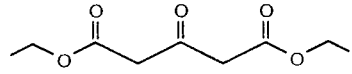 | diethyl acetonedicarboxylate |
| 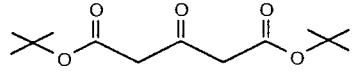 | di-tert.-butyl acetonedicarboxylate |
| 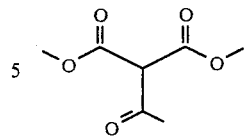 | dimethyl acetylmalonate |
| 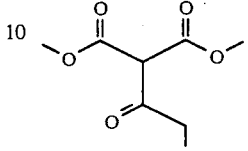 | dimethyl propionylmalonate |
| 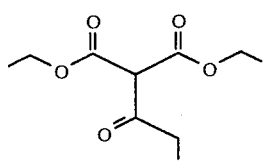 | diethyl propionylmalonate |
| 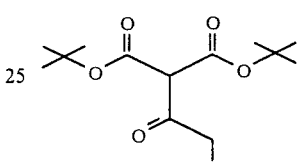 | di-tert.-butyl propionylmalonate |
| 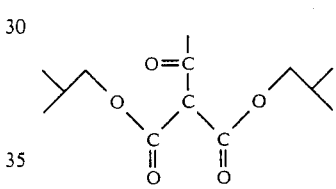 | di-iso-butyl acetylmalonate |
| 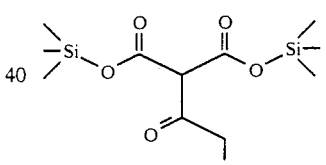 | di-trimethylsilyl propionylmalonate |
| 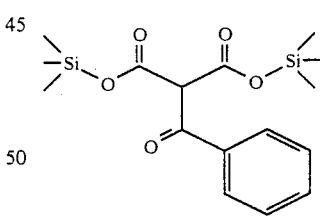 | di-trimethylsilyl benzoylmalonate |
| 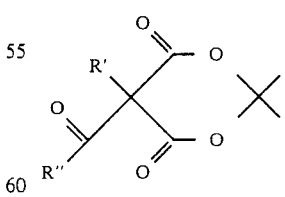 | R' = Br, R" = $CH_3$ cycloisopropylidene acetylbromomalonate |
| 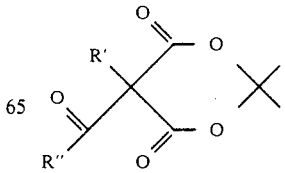 | R' = $CH_3$, R" = $CH_3$ cycloisopropylidene acetylmethylmalonate |

-continued

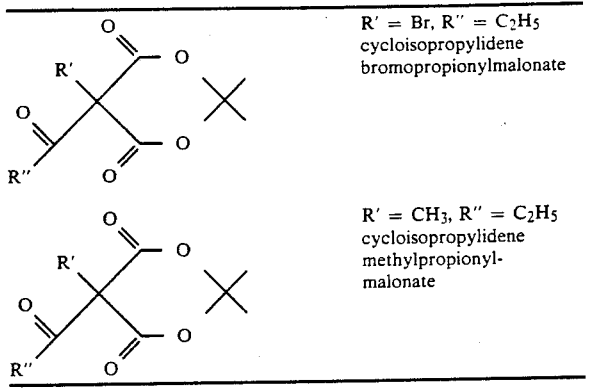

R' = Br, R" = C₂H₅
cycloisopropylidene
bromopropionylmalonate

R' = CH₃, R" = C₂H₅
cycloisopropylidene
methylpropionyl-
malonate

The preparation of such β-ketocarboxylic acid esters is prior art.

Mixtures of the above β-ketocarboxylic acid esters may also be employed.

The β-carboxylic acid esters (c) are in general present in the radiation-sensitive mixture according to the invention in an amount of from 3 to 35, preferably from 10 to 25, % by weight, based on the total amount of the mixture (a), (b) and (c).

The radiation-sensitive mixture according to the invention may furthermore contain additional conventional assistants and adjuvants.

The mixtures according to the invention are preferably dissolved in an organic solvent, the solids content in general being from 5 to 40% by weight. Preferred solvents are aliphatic ketones, ethers and esters, as well as mixtures of these. Particularly preferred solvents are alkylene glycol monoalkyl ethers, for example ethyl cellosolve, butylglycol, methyl cellosolve and 1-methoxy-2-propanol, alkylene glycol alkyl ether esters, for example methyl cellosolve acetate, ethyl cellosolve acetate, methyl propylene glycol acetate and ethyl propylene glycol acetate, ketones, for example cyclohexanone, cyclopentanone and methyl ethyl ketone, as well as acetates, such as butyl acetate, and aromatics, such as toluene and xylene. The choice of the appropriate solvent or solvent mixture depends on the choice of the particular phenolic polymer, novolac and photosensitive component.

Adjuvants such as adhesion promoters, wetting agents, dyes and plasticizers may also be added.

Where appropriate, small amounts of sensitizers may also be added, in order to sensitize the compounds in the range from longer-wave ultraviolet to the visible. Polycyclic aromatics, such as pyrene and perylene, are preferred for this purpose, but other dyes which act as sensitizers may also be used.

In the process according to the invention for the preparation of reliefs, a radiation-sensitive recording layer which essentially consists of the radiation-sensitive mixture according to the invention is exposed imagewise with a dose such that the solubility of the exposed areas in aqueous alkaline solvents increases and these exposed areas may then be selectively removed with the alkaline developer.

The radiation-sensitive mixture according to the invention may be used as a photoresist for the preparation of relief structures for semiconductor components.

The photoresist solution containing the radiation-sensitive mixture according to the invention is in general applied in a thickness of from 0.1 to 5 μm, preferably from 0.5 to 1.5 μm, onto a suitable substrate, for example a surface-oxidized silicon wafer, by spin coating, and is then dried (e.g. at from 70° to 130° C.) and exposed imagewise, under a photomask, to a suitable light source. The latter is in particular a source of shortwave ultraviolet (deep UV) with wavelengths of from 200 to 300 nm. A KrF Excimer laser (248 nm) is particularly suitable. After imagewise exposure, with or without brief postbake at up to 150° C., development is carried out with conventional aqueous alkaline developer solution, in general at a pH of from 12 to 14, in the course of which the exposed areas are washed out. The resolution is within the submicron range. The exposure energy required for the radiation-sensitive mixtures according to the invention is in general from 30 to 200 mJ/cm² for coatings 1 μm thick.

In the Examples which follow, parts and percentages are by weight, unless stated otherwise.

EXAMPLE 1

A photoresist solution is prepared from 80 parts of poly-(p-hydroxystyrene) (a commercial product from Polysciences Inc., molecular weight 1,500–7,000 g/mol), 5 parts of triphenylsulfonium hexafluoroarsenate (a commercial product from ALFA), 15 parts of isobutyl acetoacetate and 280 parts of ethylene glycol monomethyl ether acetate, and the solution is subsequently passed through a filter of pore diameter 0.2 μm.

The resist solution is then spun-coated at 4,000 rpm for 30 seconds onto a silicon wavelength having an SiO₂ surface which itself has been coated with hexamethyldisilazane as an adhesion promoter, the dry layer thickness of resist obtained being about 1 μm. The wafer is dried for 3 minutes on a hot plate at 80° C., then brought into contact with a test mask having an image structure and exposed for 3 seconds to an Excimer laser (λ=248 nm, E=35 mW/cm²). The wafer is then heated for 1 minute at 80° C. and developed using a developer of pH 12.1–13.4.

EXAMPLE 2

A photoresist solution is prepared from 80 parts of poly-(p-hydroxystyrene), 6 parts of triphenylsulfonium hexafluoroarsenate, 14 parts of 2-carbethoxy-cyclopentanone and 280 parts of ethylene glycol xonomethyl ether acetate. The procedure followed is as in Example 1, but with 5 seconds, exposure, in order to ensure that under identical conditions the exposed areas are fully removed.

EXAMPLE 3

A photoresist solution is prepared from 80 parts of poly-(p-hydroxystyrene), 7 parts of triphenylsulfonium hexafluoroarsenate, 13 parts of 2-acetylbutyrolactone and 280 parts of ethylene glycol monomethyl ether acetate. The procedure followed is as in Example 1. The sensitivity is 160 mJ/cm².

EXAMPLE 4

A photoresist solution is prepared from 75 parts of poly-(p-hydroxystyrene), 2 parts of triphenylsulfonium hexafluoroarsenate, 23 parts of dimethyl acetonedicarboxylate and 280 parts of ethylene glycol monomethyl ether acetate. The procedure followed is as in Example 1. The sensitivity is 100 mJ/cm².

EXAMPLE 5

A photoresist solution is prepared from 80 parts of poly-(p-hydroxystyrene), 5 parts of triphenylsulfonium hexafluoroarsenate, 15 parts of diethyl propionylmalonate and 280 parts of ethylene glycol monomethyl ether acetate. The procedure followed is as in Example 1. The sensitivity is 70 mJ/cm².

EXAMPLE 6

A photoresist solution prepared according to Example 5 is processed as in Example 1, but without the postbake step of heating at 80° C. for 1 minute. The sensitivity is 30 mJ/cm².

We claim:

1. A radiation-sensitive mixture essentially consisting of
   (a) a water-insoluble binder or binder mixture which is soluble in aqueous alkaline solutions,
   (b) a compound which upon irradiation forms a strong acid and
   (c) one or more organic compounds which inhibit the solubility of (a) in aqueous alkaline solutions,
   wherein the organic compound (c) is a β-ketoacid ester of the general formula (I)

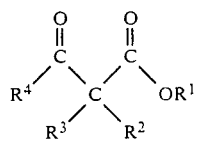

where
   $R^1$ is alkyl, cycloalkyl, aralkyl or an oxygen-containing heterocyclic radical,
   $R^2$ and $R^3$ are identical or different and each is hydrogen, halogen, alkyl, cycloalkyl, aralkyl, aryl, alkoxy or —CO—OR$^1$, or $R^1$ together with $R^2$, or $R^3$ together with $R^4$ are linked by —(CH$_2$)$_n$—, where n is from 2 to 5, to form a ring, and
   $R^4$ is alkyl, cycloalkyl, aryl or —CH$_2$—CO—OR$^1$, or organic compound (c) is a β-ketoacid ester selected from the group consisting of cycloisopropylidene acetylbromomalonate, cycloisopropylidene acetylmethylmalonate, cycloisopropylidene bromopropionylmalonate, cycloisopropylidene methylporpionylmalonate, trimethylsilyl acetoacetate, di(-trimethylsilyl) propionylmalonate, and di(trimethylsilyl) benzoylmalonate.

2. A radiation-sensitive mixture as claimed in claim 1, wherein the binder (a) is a phenolic resin.

3. A radiation-sensitive mixture as claimed in claim 2, wherein the phenolic resin is a novolac having a mean molecular weight $M_n$ of from 300 to 20,000.

4. A radiation-sensitive mixture as claimed in claim 1, wherein the binder (a) is poly(p-hydroxystyrene), poly(p-hydroxy-α-methylstyrene) or a copolymer of p-hydroxystyrene and p-tert.-butoxycarbonyloxystyrene.

5. A radiation-sensitive mixture as claimed in claim 1, wherein the binder (a) is a copolymer of p-hydroxystyrene and alkoxystyrene.

6. A radiation-sensitive mixture as claimed in claim 1, wherein the binder (a) is a copolymer of p-hydroxystyrene and 2-tetrahydropyranyloxystyrene.

7. A radiation-sensitive mixture as claimed in claim 1, wherein the compound (b), which on irradiation forms a strong acid, is a sulfonium salt of the general formula (II)

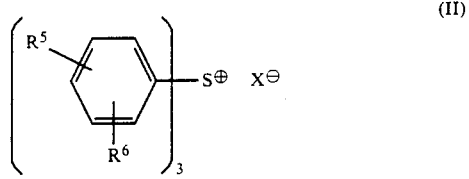

where $R^5$ and $R^6$ are identical or different and each is H, OH or one of the radicals

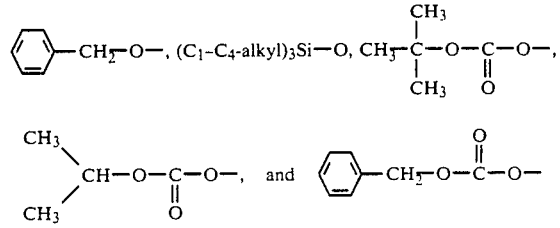

and $X^\ominus = Cl^\ominus$, $Br^\ominus$, $ClO_4^\ominus$, hexafluoroarsenate, hexafluoroantimonate, hexafluorophosphate and/or tetrafluoroborate.

8. A radiation-sensitive mixture as claimed in claim 7, wherein, in place of the sulfonium salt of the general formula (II), the compound (b) which on irradiation forms a strong acid is an iodonium salt of the general formula (III)

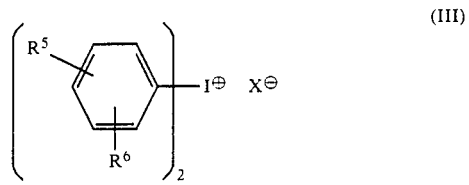

where $R^5$, $R^6$ and $X^\ominus$ have the meaning given in claim 7.

9. A radiation-sensitive mixture as claimed in claim 1, wherein the β-ketoacid ester of the general formula (I) consists of one or more acetoacetic acid esters selected from the group consisting of tert.-butyl acetoacetate, isobutyl acetoacetate, 2-tetrahydropyranyl acetoacetate, trimethylsilyl acetoacetate and cyclohexyl acetoacetate.

10. A radiation-sensitive mixture as claimed in claim 1, wherein the β-ketoacid ester of the general formula (I) is dimethyl, diethyl or di-tert.-butyl acetonedicarboxylate.

11. A radiation-sensitive mixture as claimed in claim 1, wherein the β-ketoacid ester of the general formula (I) consists of one or more dialkyl malonate derivatives selected from the group consisting of dimethyl acetylmalonate, dimethyl propionylmalonate, diethyl propionylmalonate, di-tert.-butyl propionylmalonate, di-iso-butyl acetylmalonate, di(trimethylsilyl) propionylmalonate and di(trimethylsilyl) benzoylmalonate.

12. A radiation-sensitive mixture as claimed in claim 1, wherein the β-ketoacid ester (I) is a compound selected from the group consisting of cycloisopropylidene acetylbromomalonate, cycloisopropylidene acetylmethylmalonate, cycloisopropylidene bromopropionylmalonate and cycloisopropylidene methylpropionylmalonate.

13. A process for the preparation of relief structures or for the structuring of wafers by applying a photoresist solution in a thickness of from 0.1 to 5 µm onto a silicon wafer having an SiO₂ surface which itself may be coated with hexamethyldisilazine, drying the coating, exposing it imagewise with or without subsequent heating at up to 150° C., and developing with an aqueous alkaline solution, where the photoresist solution employed contains a radiation-sensitive mixture as claimed in claim 1.

* * * * *

UNITED STATES PATENT AND TRADEMARK OFFICE
CERTIFICATE OF CORRECTION

PATENT NO. : 5,034,305

DATED : Jul. 23, 1991

INVENTOR(S) : NGUYEN-KIM et al.

It is certified that error appears in the above-identified patent and that said Letters Patent is hereby corrected as shown below:

On the cover sheet, delete the Notice reflecting disclaimed portion of the patent term.

Signed and Sealed this

Twelfth Day of April, 1994

Attest:

BRUCE LEHMAN

*Commissioner of Patents and Trademarks*

*Attesting Officer*